(12) United States Patent
Hwang et al.

(10) Patent No.: US 9,947,260 B2
(45) Date of Patent: Apr. 17, 2018

(54) AMOLED DISPLAY DEVICE WITH DEMULTIPLEXER COMPRISING FIRST TO THIRD SWITCHES TURNING ON IN ROTATION DURING FRAME IMAGE

(71) Applicant: Shenzhen China Star Optoelectronics Technology Co., Ltd., Shenzhen, Guangdong (CN)

(72) Inventors: Tai Jiun Hwang, Guangdong (CN); Jih Shiang Lee, Guangdong (CN); Zhenling Wang, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 0 days.

(21) Appl. No.: 14/785,984

(22) PCT Filed: Jul. 2, 2015

(86) PCT No.: PCT/CN2015/083181
§ 371 (c)(1),
(2) Date: Dec. 13, 2016

(87) PCT Pub. No.: WO2016/197427
PCT Pub. Date: Dec. 15, 2016

(65) Prior Publication Data
US 2017/0154562 A1    Jun. 1, 2017

(30) Foreign Application Priority Data

Jun. 8, 2015  (CN) .......................... 2015 1 0310376

(51) Int. Cl.
*G09G 3/30* (2006.01)
*G09G 3/20* (2006.01)
(Continued)

(52) U.S. Cl.
CPC ......... *G09G 3/2074* (2013.01); *G09G 3/3266* (2013.01); *G09G 3/3291* (2013.01);
(Continued)

(58) Field of Classification Search
CPC .......... G09G 3/30; G09G 3/32; G09G 3/2074; G09G 3/3208; G09G 3/3216; G09G 3/3225; G09G 3/3266; G09G 3/3291
(Continued)

(56) References Cited

U.S. PATENT DOCUMENTS

2001/0050665 A1* 12/2001 Yeo ...................... G09G 3/3688
                                                        345/87
2006/0151745 A1*  7/2006 Kim ........................ G09G 3/325
                                                        252/301.16
(Continued)

FOREIGN PATENT DOCUMENTS

| CN | 1819002   | 8/2006  |
|----|-----------|---------|
| CN | 102376281 | 3/2012  |
| CN | 104112423 | 10/2014 |

OTHER PUBLICATIONS

Chinese Office Action and Search Report for Chinese Patent Application No. 201510310376.7, dated Jul. 12, 2017.

*Primary Examiner* — Alexander Eisen
*Assistant Examiner* — Nelson Lam
(74) *Attorney, Agent, or Firm* — Kim Winston LLP

(57) ABSTRACT

A demultiplexer and an AMOLED display device are disclosed. The present disclosure relates to the technical field of display, whereby the technical problem of color distortion of image in the prior art can be solved. The demultiplexer comprises a first switch, a second switch, and a third switch used for charging a first sub pixel, a second sub pixel, and a third sub pixel of a pixel unit respectively, wherein the first switch, the second switch, and the third switch are turned on in rotation; and wherein for the pixel unit, in three frame (Continued)

images, the first switch is turned on first in one of said three frame images, the second switch is turned on first in another one of said three frame images, and the third switch is turned on first in a remaining one of said three frame images. The demultiplexer of the present disclosure can be used in small sized AMOLED display device.

8 Claims, 3 Drawing Sheets

(51) Int. Cl.
    *G09G 3/3266*     (2016.01)
    *G09G 3/3291*     (2016.01)
    *H01L 27/32*     (2006.01)

(52) U.S. Cl.
    CPC ... *H01L 27/3248* (2013.01); *G09G 2300/043* (2013.01); *G09G 2310/0297* (2013.01); *G09G 2320/0666* (2013.01)

(58) Field of Classification Search
    USPC .................. 345/76–83, 87–104; 315/169.3
    See application file for complete search history.

(56) References Cited

U.S. PATENT DOCUMENTS

| | | | |
|---|---|---|---|
| 2006/0250332 A1* | 11/2006 | Lo | G09G 3/20 345/76 |
| 2007/0242016 A1* | 10/2007 | Choi | G09G 3/3233 345/92 |
| 2008/0170010 A1* | 7/2008 | Kim | G09G 3/3233 345/76 |
| 2008/0180369 A1* | 7/2008 | Chiu | G09G 3/3614 345/87 |
| 2009/0167648 A1* | 7/2009 | Jeon | G09G 3/3233 345/76 |
| 2009/0289878 A1* | 11/2009 | Chen | G09G 3/3688 345/87 |
| 2013/0141320 A1* | 6/2013 | Kim | G09G 3/3685 345/92 |
| 2014/0087532 A1* | 3/2014 | Sun | H01L 29/78621 438/232 |
| 2014/0139124 A1* | 5/2014 | Kim | G09G 3/3225 315/172 |
| 2014/0191931 A1* | 7/2014 | Kim | G09G 3/3291 345/76 |
| 2014/0333676 A1* | 11/2014 | Fujii | G09G 3/2003 345/690 |
| 2015/0235616 A1* | 8/2015 | Wu | G09G 5/04 345/694 |
| 2015/0248855 A1* | 9/2015 | Kim | G09G 3/2074 345/590 |
| 2016/0189670 A1* | 6/2016 | Kim | G09G 5/02 345/690 |
| 2016/0189671 A1* | 6/2016 | Kim | G09G 3/3291 345/690 |

* cited by examiner

AMOLED DISPLAY DEVICE WITH DEMULTIPLEXER COMPRISING FIRST TO THIRD SWITCHES TURNING ON IN ROTATION DURING FRAME IMAGE

CROSS REFERENCE TO RELATED APPLICATION

The present application claims benefit of Chinese patent application CN 201510310376.7, entitled "Demultiplexer and AMOLED Display Device" and filed on Jun. 8, 2015, which is incorporated herein by reference.

FIELD OF THE INVENTION

The present disclosure relates to the technical field of display, and particularly to a demultiplexer and an Active-Matrix Organic Light-Emitting Diode (AMOLED) display device.

BACKGROUND OF THE INVENTION

The Organic Light-Emitting Diodes (OLEDs) are increasingly used in the display field because of the advantages of self light-emitting, a simple, super light and thin structure, a fast response speed, and wide viewing-angles. The AMOLED display device is an active display device and has been widely used in various flat display devices.

In mobile phones and other small sized display devices, since the space therein is limited, a multiplexer is generally used in the data driver in order to save the number of the data drivers or reduce the number of the output ends in an integrated circuit chip, so that the red data signal, the green data signal, and the blue data signal of a pixel unit can be output through one data output end.

A demultiplexer is arranged between the data driver and the pixel unit array. When one pixel unit is charged, during the procedure when the gate line is turned on continuously, the demultiplexer turns on the three data lines corresponding to the pixel unit in sequence, so that the red sub pixel, the green sub pixel, and the blue sub pixel of the pixel unit are charged in sequence.

However, when the green sub pixel and the blue sub pixel are charged after the red sub pixel is charged, since the gate line is turned on continuously, the data voltage of the red sub pixel would be lower than a normal value due to the stray capacitors of a corresponding data line and the leakage current generated when the corresponding data line is turned off. In this case, the technical problem of color distortion of the image displayed therein would be resulted in.

SUMMARY OF THE INVENTION

The present disclosure aims to provide a demultiplexer and an AMOLED display device so as to solve the technical problem of color distortion of image in the prior art.

The present disclosure provides a demultiplexer, comprising a first switch, a second switch, and a third switch used for charging a first sub pixel, a second sub pixel, and a third sub pixel of a pixel unit respectively, wherein the first switch, the second switch, and the third switch are turned on in rotation; and wherein for the pixel unit, in three frame images, the first switch is turned on first in one of said three frame images, the second switch is turned on first in another one of said three frame images, and the third switch is turned on first in a remaining one of said three frame images.

According to a first embodiment, in a first frame image, the first switch is turned on first, the second switch is turned on then, and the third switch is turned on at last;

in a second frame image, the second switch is turned on first, the third switch is turned on then, and the first switch is turned on at last; and in a third frame image, the third switch is turned on first, the first switch is turned on then, and the second switch is turned on at last.

According to a second embodiment, in a first frame image, the first switch is turned on first, the third switch is turned on then, and the second switch is turned on at last;

in a second frame image, the second switch is turned on first, the first switch is turned on then, and the third switch is turned on at last; and in a third frame image, the third switch is turned on first, the second switch is turned on then, and the first switch is turned on at last.

According to a third embodiment, in six consecutive frame images:

in a first frame image, the first switch is turned on first, the second switch is turned on then, and the third switch is turned on at last;

in a second frame image, the second switch is turned on first, the third switch is turned on then, and the first switch is turned on at last;

in a third frame image, the third switch is turned on first, the first switch is turned on then, and the second switch is turned on at last;

in a fourth frame image, the first switch is turned on first, the third switch is turned on then, and the second switch is turned on at last;

in a fifth frame image, the second switch is turned on first, the first switch is turned on then, and the third switch is turned on at last; and in a sixth frame image, the third switch is turned on first, the second switch is turned on then, and the first switch is turned on at last.

The present disclosure further provides an AMOLED display device, comprising a pixel unit array, a gate driver, a data driver, and the aforesaid demultiplexer, wherein said gate driver is connected with the pixel unit array through a plurality of gate lines, and said data driver is connected with the pixel unit array through a plurality of data lines.

Further, the first switch, the second switch, and the third switch of said demultiplexer are arranged on three data lines respectively, and correspond to the first sub pixel, the second sub pixel, and the third sub pixel of one pixel unit respectively.

Further, each sub pixel comprises a thin film transistor and a pixel circuit; and a gate of said thin film transistor is connected with a corresponding gate line, a source of said thin film transistor is connected with a corresponding data line, and a drain of said thin film transistor is connected with said pixel circuit.

Further, said pixel circuit comprises a driving transistor, a capacitor, and an organic light-emitting diode;

a gate of said driving transistor is connected with the drain of said thin film transistor, a source of said driving transistor is connected with a positive electric potential of a power supply, a drain of said driving transistor is connected with a positive pole of said organic light-emitting diode, and a negative pole of said organic light-emitting diode is connected with a negative electric potential of the power supply; and one end of said capacitor is connected with the gate of said driving transistor, and another end of said capacitor is connected with the source of said driving transistor.

Further, said data driver is provided with a compensation unit which is used for compensating a loss of data voltage of a sub pixel.

Preferably, said AMOLED display device is manufactured through Complementary Metal Oxide Semiconductor (CMOS) technology.

The following beneficial effects can be brought about by the present disclosure. In the demultiplexer according to the present disclosure, three sub pixels of one pixel unit can be charged in sequence. During the procedure when the three sub pixels are charged in sequence, the data voltage of the sub pixel which is charged first would be lower than a normal value. In the demultiplexer according to the present disclosure, in three consecutive frame images, the first switch is turned on first in one of the frame images, the second switch is turned on first in another one of the frame images, and the third switch is turned on first in the remaining one of the frame images. That is, in three consecutive frame images, the first sub pixel is charged first in one of the frame images, the second sub pixel is charged first in another one of the frame images, and the third sub pixel is charged first in the remaining one of the frame images. In this manner, the data voltages of the three sub pixels would suffer a basically same reduction, while the data voltage of the sub pixel of one single color would not be reduced seriously. Therefore, the technical problem of color distortion of image in the prior art can be solved.

Other features and advantages of the present disclosure will be further explained in the following description, and partially become self-evident therefrom, or be understood through the embodiments of the present disclosure. The objectives and advantages of the present disclosure will be achieved through the structure specifically pointed out in the description, claims, and the accompanying drawings.

BRIEF DESCRIPTION OF THE DRAWINGS

The drawings necessary for explaining the embodiments are introduced briefly below to illustrate the technical solutions of the embodiments of the present disclosure more clearly.

DETAILED DESCRIPTION OF THE EMBODIMENTS

The present disclosure will be explained in details with reference to the embodiments and the accompanying drawings, whereby it can be fully understood how to solve the technical problem by the technical means according to the present disclosure and achieve the technical effects thereof, and thus the technical solution according to the present disclosure can be implemented. It should be noted that, as long as there is no structural conflict, all the technical features mentioned in all the embodiments may be combined together in any manner, and the technical solutions obtained in this manner all fall within the scope of the present disclosure.

The embodiments of the present disclosure provide a demultiplexer and an AMOLED display device comprising the demultiplexer. The demultiplexer comprises a first switch, a second switch, and a third switch used for charging a first sub pixel, a second sub pixel, and a third sub pixel of a pixel unit respectively, wherein the first switch, the second switch, and the third switch are turned on in rotation. For the pixel unit, said demultiplexer is configured so that in three frame images, the first switch is turned on first in one of said three frame images, the second switch is turned on first in another one of said three frame images, and the third switch is turned on first in a remaining one of said three frame images.

In the demultiplexer according to the embodiments of the present disclosure, three sub pixels of one pixel unit can be charged in sequence. During the procedure when the three sub pixels are charged in sequence, the data voltage of the sub pixel which is charged first would be lower than a normal value. In the demultiplexer according to the embodiments of the present disclosure, in three consecutive frame images, the first switch is turned on first in one of the frame images, the second switch is turned on first in another one of the frame images, and the third switch is turned on first in the remaining one of the frame images. That is, in three consecutive frame images, the first sub pixel is charged first in one of the frame images, the second sub pixel is charged first in another one of the frame images, and the third sub pixel is charged first in the remaining one of the frame images. In this manner, the data voltages of the three sub pixels would suffer a basically same reduction, while the data voltage of the sub pixel of one single color would not be reduced seriously. Therefore, the technical problem of color distortion of image in the prior art can be solved.

Embodiment 1

Figure 1:
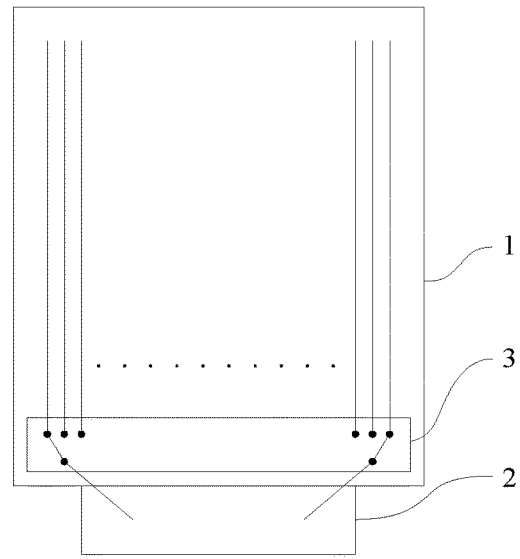
FIG. 1 schematically shows part of an AMOLED display device according to the embodiments of the present disclosure.

As shown in FIG. 1, the embodiment of the present disclosure provides an AMOLED display device, which comprises a pixel unit array 1, a gate driver (not shown in FIG. 1), a data driver 2, a demultiplexer 3 and other components. The gate driver is connected with the pixel unit array 1 through a plurality of gate lines, and the data driver 2 is connected with the pixel unit array 1 through a plurality of data lines.

Figure 2:
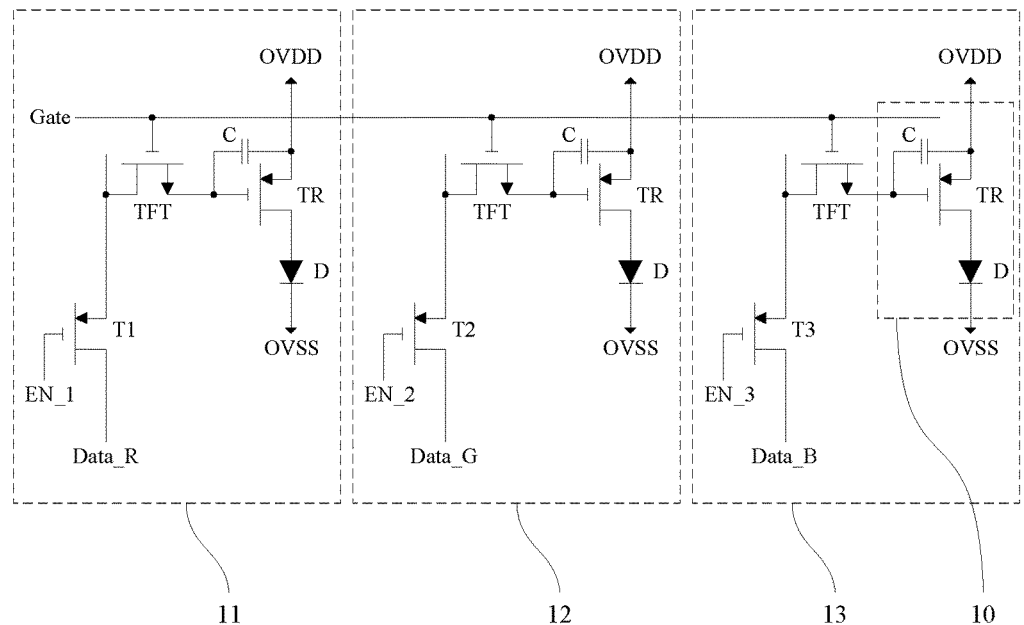
FIG. 2 schematically shows a pixel unit of the AMOLED display device according to the embodiments of the present disclosure.

As shown in FIGS. 1 and 2, the first switch T1, the second switch T2, and the third switch T3 of the demultiplexer 3 are arranged on three data lines Data_R, Data_G, and Data_B respectively, and correspond to the first sub pixel 11, the second sub pixel 12, and the third sub pixel 13 of one pixel unit respectively. According to the present embodiment, the three sub pixels are the commonly seen red sub pixel, green sub pixel, and blue sub pixel respectively.

According to the present embodiment, each sub pixel comprises a Thin Film Transistor (TFT) and a pixel circuit 10. A gate of the TFT is connected with a corresponding gate line Gate, a source of the TFT is connected with a corresponding data line, and a drain of the TFT is connected with the pixel circuit 10.

The pixel circuit comprises a driving transistor TR, a capacitor C, and an organic light-emitting diode D. A gate of TR is connected with the drain of the TFT, a source of TR is connected with a positive electric potential OVDD of a power supply, a drain of TR is connected with a positive pole of the organic light-emitting diode D, and a negative pole of the organic light-emitting diode D is connected with a negative electric potential OVSS of the power supply. One end of the capacitor C is connected with the gate of TR, and another end of the capacitor C is connected with the source of TR.

As a preferred solution, according to the present embodiment, the AMOLED display device is manufactured through CMOS technology. T1, T2, and T3 are all P-type Metal Oxide Semiconductor (PMOS) transistors, and TFT as well as TR can be N-type Metal Oxide Semiconductor (NMOS) transistors or PMOS transistors. The gates of T1, T2, and T3 are all connected with the demultiplexer, so that the turned-on and turned-off states of T1, T2, and T3 are controlled by the control signals EN_1, EN_2, and EN_3 respectively which are all output by the demultiplexer.

Figure 3:
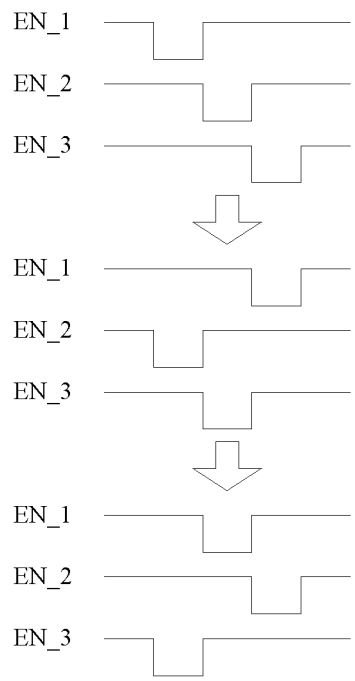
FIG. 3 is a signal time-sequence diagram of a demultiplexer according to embodiment 1 of the present disclosure.

In the demultiplexer according to the present embodiment, each pixel unit is charged with a cycling period consisting of three frames. As shown in FIG. 3, as to each pixel unit, in the demultiplexer, T1 is turned on first, T2 is turned on then, and T3 is turned on at last in the first frame image. That is, in this frame image, the first sub pixel 11 is charged first, and during the procedure when the second sub pixel 12 and the third sub pixel 13 are charged then, the data voltage of the first sub pixel 11 would be reduced since the gate line Gate is turned on continuously. In addition, when the third sub pixel 13 is charged, the data voltage of the second sub pixel 12 would also be reduced to a small extent.

In the demultiplexer, T2 is turned on first, T3 is turned on then, and T1 is turned on at last in the second frame image. That is, in this frame image, the second sub pixel 12 is charged first, and during the procedure when the third sub pixel 13 and the first sub pixel 11 are charged then, the data voltage of the second sub pixel 12 would be reduced since the gate line Gate is turned on continuously. In addition, when the first sub pixel 11 is charged, the data voltage of the third sub pixel 13 would also be reduced to a small extent.

In the demultiplexer, T3 is turned on first, T1 is turned on then, and T2 is turned on at last in the third frame image. That is, in this frame image, the third sub pixel 13 is charged first, and during the procedure when the first sub pixel 11 and the second sub pixel 12 are charged then, the data voltage of the third sub pixel 13 would be reduced since the gate line Gate is turned on continuously. In addition, when the second sub pixel 12 is charged, the data voltage of the first sub pixel 11 would also be reduced to a small extent.

In the three frame images, the first sub pixel 11, the second sub pixel 12, and the third sub pixel 13 each are charged first, second and at last once. In this case, the data voltage of each of the three sub pixels suffers a large reduction once and a small reduction once, and these reductions are almost the same. Therefore, the data voltage of the sub pixel of any one single color would not be reduced seriously, and thus the technical problem of color distortion of image in the prior art can be solved.

Further, the data driver can be provided with a compensation unit which is used for compensating a loss of data voltage of a sub pixel. Specifically, the average voltage reduction of each gray-scale can be calculated through brightness measurement, and the voltage reduction can serve as the value of the compensation voltage.

Embodiment 2

Figure 4:
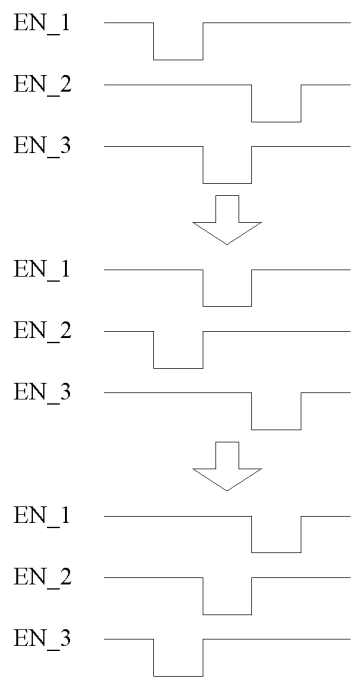
FIG. 4 is a signal time-sequence diagram of a demultiplexer according to embodiment 2 of the present disclosure.

The AMOLED display device provided by the present embodiment is basically the same as that in embodiment 1, wherein each pixel unit is charged with a cycling period consisting of three frames. The difference of embodiment 2 from embodiment 1 lies in that, as shown in FIGS. 2 and 4, in the demultiplexer, T1 is turned on first, T3 is turned on then, and T2 is turned on at last in the first frame image. That is, in this frame image, the first sub pixel 11 is charged first, and during the procedure when the third sub pixel 13 and the second sub pixel 12 are charged then, the data voltage of the first sub pixel 11 would be reduced since the gate line Gate is turned on continuously. In addition, when the second sub pixel 12 is charged, the data voltage of the third sub pixel 13 would also be reduced to a small extent.

In the demultiplexer, T2 is turned on first, T1 is turned on then, and T3 is turned on at last in the second frame image. That is, in this frame image, the second sub pixel 12 is charged first, and during the procedure when the first sub pixel 11 and the third sub pixel 13 are charged then, the data voltage of the second sub pixel 12 would be reduced since the gate line Gate is turned on continuously. In addition, when the third sub pixel 13 is charged, the data voltage of the first sub pixel 11 would also be reduced to a small extent.

In the demultiplexer, T3 is turned on first, T2 is turned on then, and T1 is turned on at last in the third frame image. That is, in this frame image, the third sub pixel 13 is charged first, and during the procedure when the second sub pixel 12 and the first sub pixel 11 are charged then, the data voltage of the third sub pixel 13 would be reduced since the gate line Gate is turned on continuously. In addition, when the first sub pixel 11 is charged, the data voltage of the second sub pixel 12 would also be reduced to a small extent.

In the three frame images, the first sub pixel 11, the second sub pixel 12, and the third sub pixel 13 each are charged first, second and at last once. In this case, the data voltage of each of the three sub pixels suffers a large reduction once and a small reduction once, and these reductions are almost the same. Therefore, the data voltage of the sub pixel of any one single color would not be reduced seriously, and thus the technical problem of color distortion of image in the prior art can be solved.

Embodiment 3

Figure 5:
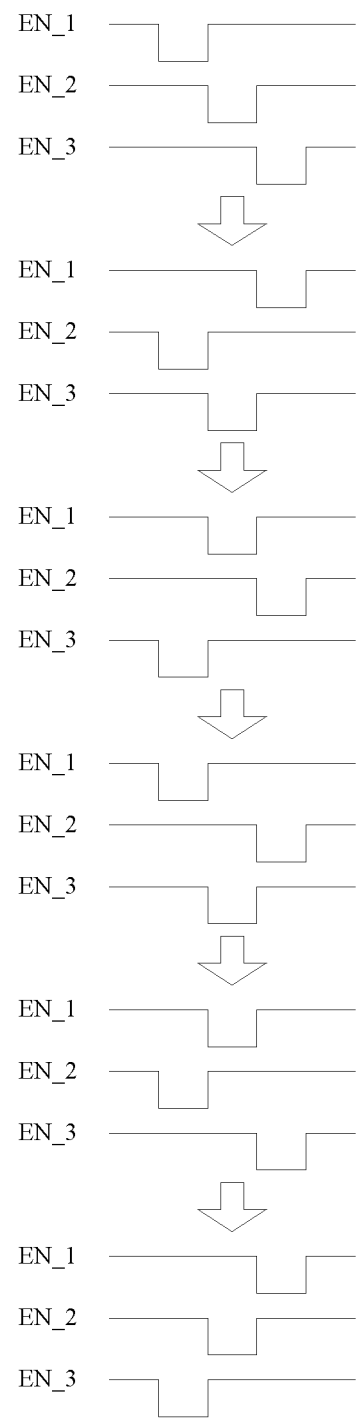
FIG. 5 is a signal time-sequence diagram of a demultiplexer according to embodiment 3 of the present disclosure.

The AMOLED display device provided by the present embodiment is basically the same as those in embodiment 1 and embodiment 2. The difference of embodiment 3 from embodiment 1 and embodiment 2 lies in that, as shown in FIGS. 2 and 5, in the demultiplexer according to the present embodiment, each pixel unit is charged with a cycling period consisting of six frames.

In the demultiplexer, T1 is turned on first, T2 is turned on then, and T3 is turned on at last in the first frame image. That is, in this frame image, the first sub pixel 11 is charged first, and during the procedure when the second sub pixel 12 and the third sub pixel 13 are charged then, the data voltage of the first sub pixel 11 would be reduced since the gate line Gate is turned on continuously. In addition, when the third sub pixel 13 is charged, the data voltage of the second sub pixel 12 would also be reduced to a small extent.

In the demultiplexer, T2 is turned on first, T3 is turned on then, and T1 is turned on at last in the second frame image. That is, in this frame image, the second sub pixel 12 is charged first, and during the procedure when the third sub pixel 13 and the first sub pixel 11 are charged then, the data voltage of the second sub pixel 12 would be reduced since the gate line Gate is turned on continuously. In addition, when the first sub pixel 11 is charged, the data voltage of the third sub pixel 13 would also be reduced to a small extent.

In the demultiplexer, T3 is turned on first, T1 is turned on then, and T2 is turned on at last in the third frame image. That is, in this frame image, the third sub pixel 13 is charged first, and during the procedure when the first sub pixel 11 and the second sub pixel 12 are charged then, the data voltage of the third sub pixel 13 would be reduced since the gate line Gate is turned on continuously. In addition, when the second sub pixel 12 is charged, the data voltage of the first sub pixel 11 would also be reduced to a small extent.

In the demultiplexer, T1 is turned on first, T3 is turned on then, and T2 is turned on at last in the fourth frame image. That is, in this frame image, the first sub pixel 11 is charged first, and during the procedure when the third sub pixel 13 and the second sub pixel 12 are charged then, the data voltage of the first sub pixel 11 would be reduced since the gate line Gate is turned on continuously. In addition, when the second sub pixel 12 is charged, the data voltage of the third sub pixel 13 would also be reduced to a small extent.

In the demultiplexer, T2 is turned on first, T1 is turned on then, and T3 is turned on at last in the fifth frame image. That is, in this frame image, the second sub pixel 12 is charged first, and during the procedure when the first sub pixel 11 and the third sub pixel 13 are charged then, the data voltage of the second sub pixel 12 would be reduced since the gate line Gate is turned on continuously. In addition, when the third sub pixel 13 is charged, the data voltage of the first sub pixel 11 would also be reduced to a small extent.

In the demultiplexer, T3 is turned on first, T2 is turned on then, and T1 is turned on at last in the sixth frame image. That is, in this frame image, the third sub pixel 13 is charged first, and during the procedure when the second sub pixel 12 and the first sub pixel 11 are charged then, the data voltage of the third sub pixel 13 would be reduced since the gate line Gate is turned on continuously. In addition, when the first sub pixel 11 is charged, the data voltage of the second sub pixel 12 would also be reduced to a small extent.

In the six frame images, the first sub pixel 11, the second sub pixel 12, and the third sub pixel 13 each are charged first, second and at last twice. In this case, the data voltage of each of the three sub pixels suffers a large reduction twice and a small reduction twice, and these reductions are almost the same. Therefore, the data voltage of the sub pixel of any one single color would not be reduced seriously, and thus the technical problem of color distortion of image in the prior art can be solved.

The above embodiments are described only for better understanding, rather than restricting, the present disclosure. Any person skilled in the art can make amendments to the implementing forms or details without departing from the spirit and scope of the present disclosure. The protection scope of the present disclosure shall be determined by the scope as defined in the claims.

The invention claimed is:

1. A demultiplexer, comprising a first switch, a second switch, and a third switch used for charging a first sub pixel, a second sub pixel, and a third sub pixel of a pixel unit respectively,
   wherein the first switch, the second switch, and the third switch are turned on in rotation;
   wherein for the pixel unit, in three frame images, the first switch is turned on first in one of said three frame images, the second switch is turned on first in another one of said three frame images, and the third switch is turned on first in a remaining one of said three frame images; and
   wherein in a first frame image, the first switch is turned on first, the second switch is turned on then, and the third switch is turned on at last; in a second frame image, the second switch is turned on first, the third switch is turned on then, and the first switch is turned on at last; and in a third frame image, the third switch is turned on first, the first switch is turned on then, and the second switch is turned on at last.

2. An Active-Matrix Organic Light-Emitting Diode (AMOLED) display device, comprising a pixel unit array, a gate driver, a data driver, and a demultiplexer,
   wherein said gate driver is connected with the pixel unit array through a plurality of gate lines, and said data driver is connected with the pixel unit array through a plurality of data lines;
   wherein said demultiplexer comprises a first switch, a second switch, and a third switch which are used for charging a first sub pixel, a second sub pixel, and a third sub pixel of a pixel unit respectively, and the first switch, the second switch, and the third switch are turned on in rotation;
   wherein for the pixel unit, in three frame images, the first switch is turned on first in one of said three frame images, the second switch is turned on first in another one of said three frame images, and the third switch is turned on first in a remaining one of said three frame images; and
   wherein at least one of:
      in a first frame image, the first switch is turned on first, the second switch is turned on then, and the third switch is turned on at last; in a second frame image, the second switch is turned on first, the third switch is turned on then, and the first switch is turned on at last; and in a third frame image, the third switch is turned on first, the first switch is turned on then, and the second switch is turned on at last; or
      in a first frame image, the first switch is turned on first, the third switch is turned on then, and the second switch is turned on at last; in a second frame image, the second switch is turned on first, the first switch is turned on then, and the third switch is turned on at last; and in a third frame image, the third switch is turned on first, the second switch is turned on then, and the first switch is turned on at last.

3. The AMOLED display device according to claim 2, wherein the first switch, the second switch, and the third switch of said demultiplexer are arranged on three data lines respectively, and correspond to the first sub pixel, the second sub pixel, and the third sub pixel of one pixel unit respectively.

4. The AMOLED display device according to claim 3,
   wherein each sub pixel comprises a thin film transistor and a pixel circuit; and
   wherein a gate of said thin film transistor is connected with a corresponding gate line, a source of said thin film transistor is connected with a corresponding data line, and a drain of said thin film transistor is connected with said pixel circuit.

5. The AMOLED display device according to claim 4,
   wherein said pixel circuit comprises a driving transistor, a capacitor, and an organic light-emitting diode;
   wherein a gate of said driving transistor is connected with the drain of said thin film transistor, a source of said driving transistor is connected with a positive electric potential of a power supply, a drain of said driving transistor is connected with a positive pole of said organic light-emitting diode, and a negative pole of said organic light-emitting diode is connected with a negative electric potential of the power supply; and wherein one end of said capacitor is connected with the gate of said driving transistor, and another end of said capacitor is connected with the source of said driving transistor.

6. The AMOLED display device according to claim 2, wherein said data driver is provided with a compensation unit which is used for compensating a loss of data voltage of a sub pixel.

7. The AMOLED display device according to claim 2, wherein said AMOLED display device is manufactured through Complementary Metal Oxide Semiconductor (CMOS) technology.

8. A demultiplexer, comprising a first switch, a second switch, and a third switch used for charging a first sub pixel, a second sub pixel, and a third sub pixel of a pixel unit respectively,
  wherein the first switch, the second switch, and the third switch are turned on in rotation;
  wherein for the pixel unit, in three frame images, the first switch is turned on first in one of said three frame images, the second switch is turned on first in another one of said three frame images, and the third switch is turned on first in a remaining one of said three frame images; and
  wherein in a first frame image, the first switch is turned on first, the third switch is turned on then, and the second switch is turned on at last; in a second frame image, the second switch is turned on first, the first switch is turned on then, and the third switch is turned on at last; and in a third frame image, the third switch is turned on first, the second switch is turned on then, and the first switch is turned on at last.

* * * * *